Figure 1:
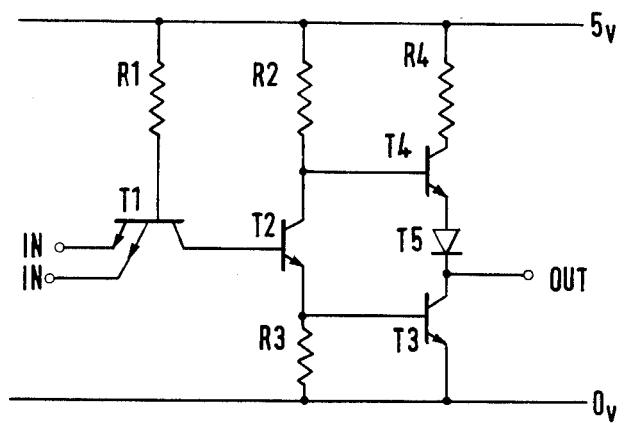

United States Patent [19]

Colaco

[11] 4,049,975
[45] Sept. 20, 1977

[54] TRANSISTOR CIRCUITS

[75] Inventor: Stephen Francis Colaco, Sale, England

[73] Assignee: Ferranti Limited, Hollinwood, England

[21] Appl. No.: 752,889

[22] Filed: Dec. 21, 1976

[30] Foreign Application Priority Data

Dec. 23, 1975 United Kingdom .............. 52680/75

[51] Int. Cl.² ........................................... H03K 19/08
[52] U.S. Cl. .................................. 307/213; 307/215; 307/299 A; 357/36
[58] Field of Search .................. 307/299 A, 213, 215; 357/36

[56] References Cited

U.S. PATENT DOCUMENTS

| | | | |
|---|---|---|---|
| 3,676,713 | 7/1972 | Wiedmann | 307/299 A |
| 3,828,202 | 8/1974 | Stopper | 307/299 A |
| 3,934,157 | 1/1976 | Evans | 307/213 |

*Primary Examiner*—John S. Heyman
*Attorney, Agent, or Firm*—Cameron, Kerkam, Sutton, Stowell & Stowell

[57] ABSTRACT

In a non-gold-doped TTL device to be energized by a potential supply of at least 4.5 volts; the charge carrier concentration within a NPN multi-emitter input transistor is reduced by connecting together the base and the collector; undesirable emitter-to-emitter transistor action is prevented, by reducing the inverse current gain factor of the input transistor, and preventing this transistor from saturating, by providing a diode within the phase splitter stage, to ensure that the input threshold level of the device is at least two forward biased diode potentials above the least positive supply rail; and providing a suitable pull-up stage for the output transistor, which pull-up stage may comprise a modified Darlington pair of transistors, including a resistor between the emitter of the first transistor and the base of the second transistor, and a resistor between the base and the emitter of the second transistor.

6 Claims, 3 Drawing Figures

TRANSISTOR CIRCUITS

This invention relates to transistor circuits and in particular to transistor-transistor logic (TTL) circuit arrangements to be energised by a potential supply of at least 4.5 volts, and to semiconductor integrated circuit devices embodying such TTL circuit arrangements. Conventionally a TTL circuit arrangement has NPN transistors.

Although TTL circuit arrangements can be constructed from discrete circuit elements conventionally each such circuit arrangement is embodied at least partially in a monolithic semiconductor body to comprise a TTL circuit device. Each TTL circuit device may be manufactured by one of a plurality of different possible methods in order to embody at least partially a particular TTL circuit arrangement in a monolithic semiconductor body. Hence, whilst the present invention relates to TTL circuit arrangements each capable of being embodied in an integrated circuit device by more than one method of manufacturing such a device, it does not relate to such TTL circuit arrangements when constructed from discrete circuit elements.

A TTL circuit arrangement usually includes a NPN multi-emitter input transistor, having an emitter individually connected to each required input for the circuit arrangement. The base is connected via a resistor to a first, supply rail to be maintained at a finite positive potential level. The collector is connected to a phase splitter stage connected between the first, supply rail and a second rail to be maintained at a less positive potential level than the first rail, and usually zero potential. There are two outputs of the phase splitter stage, one connected to the base of an output transistor, and one to a pull-up stage for the output transistor. The output transistor and the pull-up stage are connected in series between the first and second rails. The required output for the circuit arrangement is provided at a point between the output transistor and the pull-up stage.

Such a circuit arrangement comprises a NAND gate in accordance with the positive logic convention, and other forms of logic gate may be provided by modifying this NAND gate construction by the addition of inverter stages at appropriate points. Such logic circuit arrangements, if desired, alternatively, can be operated in accordance with the negative logic convention.

In a conventional TTL circuit the arrangement of the phase splitter stage is such that it includes a transistor, the base of which is connected to the collector of the input transistor, has its collector connected via a resistor to the first supply rail to be maintained at the first potential level. The emitter is connected via another resistor to the second rail to be maintained at the second potential level. The output of the phase splitter stage connected to the output transistor is provided at a point between the emitter and the resistor in the emitter circuit of the transistor of the phase splitter stage. The other output of the phase splitter stage connected to the pull-up stage for the output transistor is provided at a point between the collector and the resistor in the collector circuit of the transistor of the phase splitter stage. The pull-up stage may have any convenient active or passive form. The arrangement for an active pull-up stage for the output transistor comprises a resistor between the collector of a transistor of the active pull-up stage and the first rail, and a diode between the emitter of the transistor and the output transistor. The output of the circuit arrangement is provided at a point between the diode and the output transistor.

In the operation of the conventional NAND gate TTL circuit arrangement, when at least one of the emitters of the input transistor is at a low positive potential level, considered to be the low input state for the circuit arrangement, the transistor of the phase splitter stage, and the output transistor, are switched off, the transistor of the active pull-up stage acts as an emitter follower, and the potential level of the output is at a high positive potential level. When all the emitters of the input transistors are at a high positive potential level, considered to be the high input stage for the circuit arrangement, the transistor of the phase splitter stage and the output transistor are switched on, and are in a saturated condition. The transistor of the active pull-up stage is switched off. The potential level of the output is a low positive potential level.

If the potential level of each emitter of the input transistor, or the input value of the circuit arrangement, is increased from zero to at least a value above the zero potential of the second rail equal to the maximum obtainable potential difference across one forward biased diode, or P-N junction, if included in the circuit arrangement, and when the circuit arrangement is operating, the transistor of the phase splitter stage is switched on, but the output transistor remains switched off. Such a potential difference may be in the range 0.4 to 1.0 volt, and preferably is in the range 0.65 to 0.75 volt at 25° C. The output transistor does not become switched on until the potential level of each emitter of the input transistor is increased at least to a level above that of the second rail substantially equal to the maximum obtainable potential difference across two forward biased diodes, or P-N junctions. This potential level comprises the input threshold value for the circuit arrangement. As the potential level of each emitter of the input transistor, or the input value of the circuit arrangement, is increased still further the output transistor saturates. As the input value of the circuit arrangement increases again, the transistor of the phase splitter stage saturates, and the transistor of the active pull-up stage, previously switched on, is switched off. The input value of the circuit arrangement can increase to a level below the first, supply voltage level of the first rail by an amount substantially equal to the maximum obtainable potential difference across two forward biased diodes, or P-N junctions.

Thus, the input voltage swing of the circuit arrangement is between substantially two maximum otainable forward biased diode potentials above zero to substantially two maximum obtainable forward biased diode potentials below the supply voltage level. The output voltage swing of the circuit arrangement is between the voltage at which the output transistor saturates to substantially two maximum obtainable forward biased diode potentials below the supply voltage level. The low input state for the circuit arrangement is when the input value is between the threshold value and that at which the transistor of the active pull-up stage is switched off, and the high input state is when the input value exceeds that at which the transistor of the active pull-up stage is switched off.

TTL integrated circuit devices have obtained wide acceptance, and their operating characteristics are now required to be within established ranges if the devices are to obtain commercial acceptance. Such A.C. and D.C. operating characteristics of a TTL circuit device can be specified to include the requirement that the input threshold potential level of the device above the zero potential level of the second rail should be as high as possible. It is required also to be able to turn off completely the transistor of the active pull-up stage when the device is in the low input state. The output impedance to the first, supply rail is low when the device is in either its low or high input stages. Therefore, the device is capable of driving a component with a significant amount of capacitance without degrading its propagation delay. The propagation delay of the device usually is of the order of 10 nanoseconds. The supply voltage is at least 4.5 volts, and preferably is 5 volts. The output of the device swings between the voltage at which the output transistor of the device saturates, and is required to be as low as possible, and usually is 0.3 volts, and a voltage of the order of 3.4 volts. The high input state current of the device is as low as possible, and usually is of the order of 5 micro-amperes at 2.4 volts. Further, it is required that the total current gain factor associated with the input transistor, and as viewed from an external circuit, is as low as possible commensurate with the input threshold potential level of the device being as high as possible, and the output transistor saturating at a voltage as low as possible.

Generally, it is arranged that circuit elements of different types within the semiconductor body of an integrated circuit device have constructions which closely resemble each other and in particular closely resemble the construction of bipolar transistors provided within the device. Inevitably all the transistors of a device have the same construction. Further, the method of manufacturing a bipolar transistor at least partially determines the construction of the transistor, and at least partially determines the operating characteristics of the transistor. Similarly, the method employed in manufacturing the bipolar transistors of an integrated circuit device at least partially determines the construction of other types of circuit element included within the semiconductor body of the integrated circuit device, and at least partially determines the operating characteristics of the device.

TTL circuit arrangements, and TTL integrated circuit devices embodying such circuit arrangements, and to which the present invention relates, are required to have only bipolar transistors, resistors, and diodes, each of which diode may be provided by a bipolar transistor and short-circuiting one P-N junction of the transistor. The resistors may be provided within the semiconductor body of the device and/or each may comprise a thin film resistor provided on a layer of passivating material of the semiconductor body of the device.

Conventionally TTL integrated circuit devices include bipolar transistors each manufactured by a method which includes forming the base and the emitter in separate diffusion steps. Further, the TTL integrated circuit devices are substantially uniformly doped with an element such as gold to reduce the inverse current gain factor of the constituent transistors; and to ensure that there are only low storage concentrations of charge carriers within the transistors, and that the transistors have the fast switching times when operating in the forward mode desired for TTL circuit devices. Hence, the high input state current for the devices is as low as possible, and the propagation delay of the devices is small. For convenience, in this specification such conventional methods of manufacturing bipolar transistors, and of manufacturing TTL integrated circuit devices including such transistors, will be referred to as conventional double-diffusion methods, the transistors manufactured thereby will be referred to as conventional double diffused transistors, and the TTL integrated circuit devices including such transistors will be referred to as conventional double-diffused TTL circuit devices. Further, for convenience in this specification, only gold will be considered for reducing the inverse current gain factor of the constituent transistors, and to ensure that there are only low storage concentrations of charge carriers within the transistors. Gold doping will be considered as part of a conventional double diffused method, and conventional double diffused transistors and TTL circuit devices will be considered as being substantially uniformly doped with gold.

Recently developed methods of manufacturing bipolar transistors, and of manufacturing semiconductor integrated circuit devices having bipolar transistors and other types of circuit element, each such other type of circuit element provided within the semiconductor body of the device having a construction closely resembling that of each bipolar transistor included within the device, are advantageous in that gold doping is omitted. For convenience these methods will be referred to as non-gold-doping methods, and the devices as non-gold-doped devices. Such a method may be a double diffusion method. Further, the devices embodying such transistors may be smaller, and the methods may employ fewer constituent process steps than when the conventional double diffusion methods referred to above are employed. Consequently, the manufacturing yields of such recently developed methods are greater than the conventional methods, and a greater number of devices may be provided in a slice of semiconductor material of a particular diameter, also increasing the percentage yield of devices.

Some of such recently developed methods of manufacturing bipolar transistors each include providing a semiconductor body with a shallow epitaxial layer of P conductivity type on a substrate of the same conductivity type, both the epitaxial layer and the substrate being of high resistivity material. Each bipolar transistor provided thereby has a N type collector which at least includes a heavily doped buried layer at a portion of the interface between the substrate and the epitaxial layer. The P-type base is defined within the epitaxial layer and comprises at least partially an unmodified part of the epitaxial layer, and the N type emitter comprises a diffused part within the base. Such a transistor has, for example, the so-called collector-diffusion-isolation, or Isoplanar, or VIP, or V-ATE construction. For convenience, hereinafter in this specification, such recently developed methods of manufacturing bipolar transistors, and of manufacturing semiconductor integrated circuit devices including such bipolar transistors, will be referred to as epitayial-base methods, the transistors manufactured thereby will be referred to as epitaxial-base transistors, and TTL integrated circuit devices including such transistors will be referred to as epitaxial-base TTL circuit devices. The present invention relates to such epitaxial-base TTL circuit devices, and to TTL circuit arrangements suitable to be embodied at least partially in semiconductor bodies by epitaxial-base methods.

Epitaxial-base transistors differ from conventional double-diffused transistors in that they cannot satisfactorily be gold doped, because the side effects produced by gold doping on epitaxial-base transistors significantly and adversely affect the transistors. This is because the transistors are formed at least partially in shallow epitaxial layers. Thus, the forward current gain factors of the epitaxial-base transistors are reduced by gold doping, there is increased current leakage within the transistors to unacceptable levels compared with conventional double-diffused transistors, and gold doping creates dislocations within the semiconductor material reducing the percentage yield of the epitaxial-base methods compared with conventional double-diffusion methods. These deleterious side effects are especially unfortunate because epitaxial-base transistors have a high inverse current gain factor; and unless they are suitably modified, have high storage concentrations of minority charge carriers, and have slower switching times when operating in the forward mode; than are desirable for TTL circuit devices. For the NPN multi-emitter input transistor of a TTL circuit device having a high inverse current gain factor, for example, an epitaxial-base, multi-emitter input transistor, if one emitter is at a low potential level and another is at a high potential level, due to normally encountered input voltage swings for the device, undesirable emitter-to-emitter transistor action occurs when the transistor saturates.

It is known to reduce the concentrations of stored charge carriers within non-gold-doped, and, for example, double-diffused or epitaxial-base transistors by providing each such transistor with an additional, feedback emitter connected directly to the base of the transistor. Whilst the provision of the feedback emitter decreases the switching time of, for example, an epitaxial-base transistor, it does not reduce the higher inverse current gain factor of the transistor. For convenience in this specification non-gold-doped transistors will be assumed to be provided with feedback emitters, where appropriate. Hence, epitaxial-base bipolar transistors are unsuitable merely to replace conventional double-diffused transistors in the conventional TTL circuit arrangement referred to above, even if the epitaxial-base bipolar transistors are provided with feedback emitters to reduce the high concentrations of stored charge carriers within the transistors. Alternative arrangements for reducing the high concentration of charge carrier storage for an epitaxial-base input transistor for an epitaxial-base TTL circuit device are known. However, each such known arrangement includes the provision of at least one resistor associated with the input transistor, and is disadvantageous because it increases by an undesirable extent the parasitic capacitance associated with the transistor.

It is an object of the present invention to provide a novel circuit arrangement for a TTL circuit device, and capable of being manufactured by a non-gold-doping method, the device having operating characteristics within the established ranges conventionally required for a TTL circuit device, and as specified above.

It is another object of the present invention to provide a novel TTL circuit device, manufactured by a non-gold-doping method, the device having operating characteristics within the established ranges conventionally required for a TTL circuit device, and as specified above.

According to the present invention a transistor-transistor logic (TTL) circuit arrangement having NPN transistors, and to be energised by a potential supply of at least 4.5 volts, includes a multi-emitter input transistor, having an emitter individually connected to each required input for the circuit arrangement, the base is connected via a resistor to a first, supply rail to be maintained at a first, finite positive, potential level, the collector is connected to the base to reduce, in the operation of the circuit arrangement, the concentration of stored charge carriers within the transistor, and the collector is also connected to a phase splitter stage connected between the first, supply rail and a second rail to be maintained at a second potential level, less positive than the potential level of the first, supply rail, a diode is provided within the phase splitter stage, and is connected between the input transistor and the second rail to ensure that the input threshold level of the circuit arrangement is above the potential level of the second rail by substantially the maximum obtainable potential difference across two forward biased diodes, or P-N junctions, if included within the circuit arrangement, and when the circuit arrangement is operating, one output of the phase splitter stage is connected to the base of an output transistor for the circuit arrangement, the emitter of the output transistor is connected to the second rail, and the other output of the phase splitter stage is connected to a pull-up stage for the output transistor.

In a non-gold-doped TTL circuit device embodying the circuit arrangement according to the present invention, by connecting together the base and collector of the input transistor, the charge carrier concentration within this input transistor is reduced, the collector collecting all minority charge carriers injected into the base. Thus, there is compensation for the absence of gold dopant.

Further, the inverse current gain factor of the transistor is reduced, and the transistor cannot saturate. Hence, undesirable emitter-to-emitter transistor action is not possible.

The pull-up stage may have any convenient active or passive form.

If an active pull-up stage is provided it may comprise a modified Darlington pair of transistors having a first transistor the base of which is connected to the associated output of the phase splitter stage, and a second transistor the emitter of which is connected to the collector of the output transistor, the collectors of both the first and second transistors are connected via a common resistor to the first, supply rail, the emitter of the first transistor is connected via a resistor to the base of the second transistor, which base in turn is connected via a further resistor to the emitter of the second transistor. This arrangement of the pull-up stage, whilst ensuring that the high state output voltage of the TTL circuit arrangement is sufficiently high, ensures that there is compensation for the voltage drop across the resistor between the emitter of the first transistor and the base of the second transistor of the Darlington pair. This resistor is provided to ensure that the second transistor, which replaces the diode of the conventional TTL circuit arrangement is capable of being completely switched off.

According to another aspect the present invention comprises a non-gold-doped transistor-transistor logic (TTL) circuit device at least partially embodying in a monolithic semiconductor body a TTL circuit arrangement of any one of the forms referred to above.

When the TTL circuit arrangement according to the present invention is embodied in a non-gold-doped TTL circuit device the device has operating characteristics within the established, specified ranges conventionally required for a TTL circuit device, and which have been obtained previously with conventional, gold-doped, double diffused TTL circuit devices.

Such a TTL circuit arrangement may be at least partially embodied in a semiconductor integrated circuit device comprising any form of non-gold-doped device, for example, having epitaxial-base bipolar transistors or double diffused bipolar transistors. Other types of circuit element within the semiconductor body of the device usually each have a construction closely resembling that of the transistors, although at least one of the resistors of such a device may comprise a thin-film resistor provided on a layer of passivating material on the semiconductor body of the device.

An epitaxial-base TTL circuit device is provided in a semiconductor body having a thin epitaxial layer of P conductivity type on substrate of the same conductivity type, and the base of each constituent transistor comprises at least partially an unmodified region of the epitaxial layer; and may include bipolar transistors each have the so-called collector-diffusion-isolation construction, the N type collector of each transistor comprising both a buried layer at a portion of the interface between the epitaxial layer and the substrate of the semiconductor body of the device and an isolation barrier for the transistor extending through the epitaxial layer to contact the buried layer.

Figure 2:
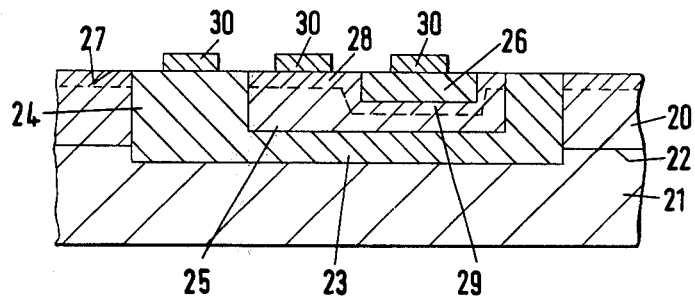
Figure 3:
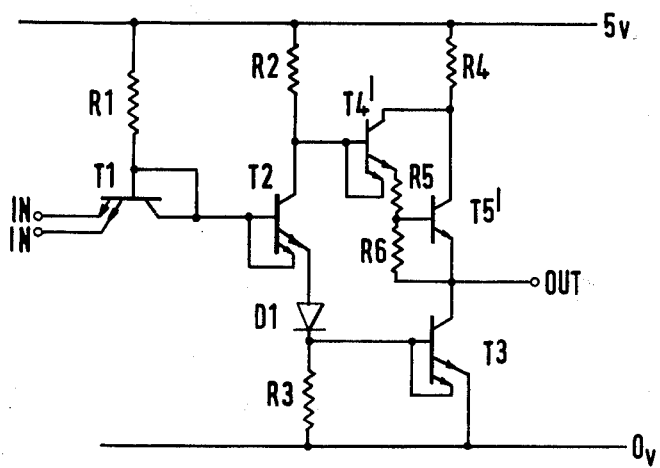

The present invention will now be described by way of example with reference to the accompanying drawings, in which:

FIG. 1 is a diagram of a known TTL circuit arrangement suitable to be at least partially embodied in the semiconductor body of a conventional, gold-doped, double diffused TTL circuit device, FIG. 2 is a section of an epitaxial-base bipolar transistor having the so-called collector-diffusion-isolation construction, and FIG. 3 is a diagram of a TTL circuit arrangement suitable to be embodied at least partially in the semiconductor body of a non-gold-doped TTL circuit device, for example, an epitaxial-base TTL circuit device having bipolar transistors each of the collector-diffusion-isolation construction of FIG. 2, and other types of circuit element, which other circuit elements, when included within the semiconductor body of the device, each having a construction closely resembling that of such epitaxial-base transistors, the epitaxial-base TTL circuit having operating characteristics within the established, specified ranges conventionally required for TTL circuit devices, and similar to the operating characteristics of the conventional, gold-doped, double diffused TTL circuit device embodying the known circuit arrangement of FIG. 1.

The known transistor-transistor logic (TTL) circuit arrangement shown in FIG. 1 is suitable to be embodied at least partially in the semiconductor body of a conventional-gold-doped, double diffused TTL circuit device, having gold-doped, double-diffused N-P-N transistors, and other circuit elements, which other circuit elements when included in the semiconductor body, each having a construction closely resembling that of such double-diffused transistor. The device comprises a NAND gate in accordance with the positive logic convention, and has an input transistor T1 with as many emitters as inputs required for the circuit arrangement, the emitters being connected individually to the input terminals. The base of the transistor T1 is connected via a resistor R1 to a first supply rail, the resistor R1 having a value of 4 Kilohms, and the supply rail being maintained at first, supply potential level of +5 volts. The collector of the transistor T1 is connected to a phase splitter stage including a transistor T2. The base of the transistor T2 is connected directly to the collector of the transistor T1. The collector of the transistor T2 is connected via a resistor R2 to the supply rail, the resistor R2 having a value of 1.6 Kilohms. The emitter of the transistor T2 is connected via a resistor R3 to a second rail, maintained at a second potential level, which is less positive than the potential level of the first rail, e.g. zero potential, the resistor R2 having a value of 1.0 Kilohms. One of the two outputs of the phase splitter stage comprises a point between the transistor T2 and the resistor R3, and is connected to the base of an output transistor T3 for the circuit arrangement. The emitter of the output transistor T3 is connected directly to the second rail maintained at zero potential level. The collector of the transistor T3 is connected to an active pull-up stage for the output transistor T3. The active pull-up stage comprises a transistor T4 and a diode provided by another transistor T5. The active pull-up stage is connected in series with the output transistor T3 between the first, supply rail and the second rail. The other output of the phase splitter stage comprises a point between the transistor T2 and the resistor R2, and is connected to the base of the transistor T4 of the active pull-up stage. The collector of the transistor T4 is connected via a resistor R4 to the first, supply rail, the resistor R4 having a value of 130 ohms. The output of the TTL circuit arrangement is provided from a point between the transistors T3 and T5, which point is connected to the output terminals.

In the operation of the NAND gate TTL circuit arrangement, when at least one of the emitters of the input transistor T1 is at a low potential level, considered to be the low input state for the circuit arrangement, the transistor of the phase splitter stage T2 and the output transistor T3 are switched off, the transistor T2 of the active pull-up stage acts as an emitter follower, and the potential level of the output is high. When all the emitters of the input transistor T1 are at a high potential level, considered to be the high input state for the circuit arrangement, the transistor T2 of the phase splitter stage and the output transistor T3 are switched on, and are in a saturated condition. The transistor T4 of the active pull-up stage is switched off. The potential level of the output is low.

If the input value of the circuit arrangement, or the potential level of each emitter of the input transistor T1, is increased from zero to at least a value above the zero potential of the second rail, equal to the maximum obtainable potential difference across one forward-biased diode, or P-N junction, if included in the circuit arrangement, the transistor T2 of the phase splitter stage is switched on, but the output transistor T3 remains switched off. The output transistor T3 does not become switched on until the input value of the circuit arrangement is increased at least to a level above that of the second rail substantially equal to the maximum obtainable potential difference across two forward-biased diodes, or P-N junctions. This potential level comprises the input threshold value for the circuit arrangement. As the input value of the circuit arrangement is increased still further the output transistor T3 saturates. As the input value of the circuit arrangement increases again, the transistor T2 of the phase splitter stage saturates, and the transistor T4 of the active pull-up stage, previously switched on, is switched off. The input value of the circuit arrangement can increase to a level below the supply voltage level of the first rail by an amount substantially equal to the maximum obtainable potential difference across two forward biased diodes, or P-N junctions.

Thus, the input voltage swing of the circuit arrangement is between substantially two maximum obtainable forward biased diode potentials above zero to substantially two maximum obtainable forward biased diode potentials below the supply voltage level. The output voltage swing of the circuit arrangement is between the voltage at which the output transistor T3 saturates to substantially two maximum obtainable forward biased diode potentials below the supply voltage level. The low input state for the circuit arrangement is when the input value is between the threshold value and that at which the transistor T4 of the active pull-up stage is switched off, and the high input state is when the input value exceeds that at which the transistor T4 is switched off.

The conventional methods of manufacturing devices embodying such TTL circuit arrangements at least partially in semiconductor bodies each include forming the emitters and bases of the constituent bipolar transistors in separate diffusion steps. Further, the semiconductor bodies are substantially uniformly doped with gold to reduce the inverse current gain factor of the transistor; and also to give low concentrations of charge carrier stored within the transistors, and for the switching items associated with the transistors when operating in the forward mode to be fast. Hence, the high input state current of such conventional double diffused TTL circuit devices is as low as possible, and the propagation delay of the devices is small.

The established ranges for the A.C. and D.C. operating characteristics of TTL circuit devices, for such devices to have commercial acceptance, for example, conventional double diffused TTL circuit devices embodying the circuit arrangement of the known form of FIG. 1, include the requirement that the input threshold potential level of the devices above the zero potential level of the second rail should be as high as possible, and is substantially the potential difference across two maximum obtainable forward biased diodes, or P-N junctions, and is in the range 0.8 to 2.0 volts, and preferably is in the range 1.3 to 1.5 volt at 25° C. It is required to be able to turn off completely the transistor T4 of the active pull-up stage when the device is in the low input state. The output impedance to the first, supply rail is low when the device is in either its high or low input states. Therefore, the device is capable of driving a component with a significant amount of capacitance without degrading its propagation delay. The propagation delay of the device usually is of the order of 10 nanoseconds. The supply voltage is at least 4.5 volts, and preferable is 5 volts. The output of the device swings between the voltage at which the output transistor T3 of the device saturates, and is required to be as low as possible, and usually is 0.3 volt, and a voltage of the order of 3.4 volts. The high input state current of the device is as low as possible, and usually is of the order of 5 micro-amperes at 2.4 volts. Further, it is required that the total current gain factor associated with the input transistor T1, and as viewed from an external circuit, is as low as possible commensurate with the input threshold potential level of the device being as high as possible, and the output transistor T3 saturating at a voltage as low as possible.

The epitaxial-base bipolar transistor, having the collector-diffusion-isolation construction shown in FIG. 2, is provided in a silicon semiconductor body comprising a shallow P type epitaxial layer 10 on a P type epitaxial layer 20 on a P type substrate 21, both the epitaxial layer 20 and the substrate 21 being of high resistivity material. Before the deposition of the epitaxial layer 20 onto the substrate 21 a heavily doped N type region is provided selectively in a portion of the surface 22 on which the epitaxial layer 20 is to be provided. Subsequently, the region forms a buried layer 23 which extends into the epitaxial layer and comprises part of the collector of the transistor. The collector is completed by the provision of a heavily doped N type isolation barrier 24 for the transistor. The isolation barrier 24 which is formed by diffusing a donor impurity selectively into parts of the epitaxial layer, extends through the epitaxial layer to the buried layer 23, and defines a P type base 25 comprising at least partially an unmodified portion of the epitaxial layer. N type emitters 26 are diffused within the base 25 adjacent to the surface 27 of the epitaxial layer spaced from the substrate, only one emitter 26 being shown in FIG. 2.

However, before the provision of the emitters 26 an acceptor impurity is diffused non-selectively into the surface 27 of the epitaxial layer remote from the substrate. This impurity does not have any significant effect on the portions of the isolation barrier 24 at the surface 27, but provides heavily doped surface portions 28 for the base, and ensures that when, subsequently, the N type emitters are provided they are surrounded within the semiconductor body by heavily doped P type regions 29. Whilst the non-selective P type diffusion is not essential, it is advantageous because it causes the gain bandwidth product of the transistor to be increased, helps to prevent the inversion of surface portions of the epitaxial layer, and helps to stabilise resistors also provided within the epitaxial layer.

An initially-continuous layer of passivating material (not shown), is provided on the surface 27 of the epitaxial layer 20 either during or after the non-selective P type diffusion step, and possibly after the emitter diffusion step if the layer of passivating material is not required to be employed also as diffusion-resist material in the emitter diffusion step. Diffusion-resist material provided on the surface 27 for the diffusion of the isolation barrier is removed before the non-selective P type diffusion step. Appropriately-shaped apertures are formed in the diffusion-resist material, employing known photolithographic techniques, for the diffusion steps. The layer of passivating material is reformed in a continuous form after the emitter diffusion step, and apertures are provided therethrough, by employing the known photolithographic techniques, for contacts 30. The contacts 30 for the transistor, and any electrical interconnections (not shown), therefor, are formed from an initially-continuous metal layer over the layer of passivating material and within the apertures therethrough. The metal layer, which, for example, is of aluminium, has parts selectively removed, by employing the known photolithographic techniques, to form the contacts and the electrical interconnections. The contacts 30, which extend through the apertures in the layer of passivating material are in contact with the isolation barrier 24 of the collector, the base 25, and each emitter 26. When a feedback emitter is provided for the transistor as referred to below, the base contact extends over a portion of the P-N junction between this emitter and the base, short-circuiting the P-N junction. Similarly a contact spans a portion of one P-N junction of a transistor where a diode is required for the other P-N junction.

Such an epitaxial-base method of manufacturing a bipolar transistor is advantageous because it requires fewer processing steps than the conventional double diffusion methods conventionally employed in the manufacture of the TTL circuit devices, and so manufacturing yields are higher. Also the size of the epitaxial-base TTL circuit devices within the semiconductor bodies are smaller than double diffused TTL circuit devices, so that more devices can be provided within a slice of semiconductor material of a particular diameter, also increasing the percentage yield of the devices.

However, a method of manufacturing an epitaxial-base transistor, for example, by employing the collector-diffusion-isolation technique, cannot be employed in manufacturing TTL circuit devices having the known circuit arrangement, shown in FIG. 1, without adversely affecting the operating characteristics of the device. This is because it is not possible to employ gold doping in the manufacture of TTL circuit devices having epitaxial-base bipolar transistors in order to reduce the inverse current gain factor of the transistors; and to give low storage concentrations of charge carriers within the transistors, and fast switching times for the transistors when operating in the forward mode; because the transistors are formed in shallow epitaxial layers. For example, gold doping has deleterious side effects when employed in combination with the collector-diffusion-isolation technique, reducing the forward current gain factor of the transistors, increasing current leakage within the device, and creating dislocations in the semiconductor material, causing a reduction in the percentage yield of the devices. The impracticability of using gold doping in combination with employing, for example, the collector-diffusion-isolation technique is especially unfortunate because unmodified collector-diffusion-isolation transistors have a high inverse current gain factor; and have high concentrations of minority charge carrier storage within the transistors, and slow switching times for the transistors when operating in the forward mode. For the NPN multi-emitter input transistor of a TTL circuit device having a high inverse current gain factor, if one emitter is at a low potential level and another emitter is at a high potential level, due to normally encountered input voltage swings for the device, undesirable emitter-to emitter transistor action occurs when the transistors saturates.

Hence, the high input state current of epitaxial-base TTL circuit devices is not as low as possible, and the propagation delay of the device is not as small as possible.

Whilst it is known to reduce the concentrations of stored charge carriers within collector-diffusion-isolation transistors by providing each such transistor with an additional, feedback emitter connected directly to the base of the transistor, the provision of the feedback emitter decreasing the switching time of the transistor, it does not reduce the high inverse current gain factor of the transistor.

Alternative arrangements for reducing the high concentration of charge carriers stored for an epitaxial-base input transistor for an epitaxial-base TTL circuit device are known. However, each such known arrangement includes the provision of at least one resistor associated with the input transistor, and is disadvantageous because it increases by an undesirable extent the parasitic capacitance associated with the transistor.

One embodiment in accordance with the present invention comprises a TTL circuit arrangement capable of being embodied at least partially within a semiconductor body, the TTL circuit device provided having epitaxial-base transistors, such as the collector-diffusion-isolation transistor of FIG. 2, the device comprising an epitaxial-base TTL circuit device. Such a device is required to have A.C. and D.C. operating characteristics within the established, specified ranges, and similar to those of a conventional double diffused TTL circuit device, but without gold doping the semiconductor body of the epitaxial-base TTL circuit device. Such a TTL circuit arrangement according to the present invention is shown in FIG. 3.

The arrangement of the input transistor T1 and the associated resistor R1 is as for the conventional double-diffused device, except that the base of the transistor T1 is also connected to the collector, so that substantially no charge carriers are stored within the transistor T1.

However, it is required, in consequence, to restore the input threshold level of the device above the zero potential level of the second rail by approximately the potential difference across two maximum obtainable forward-baised diodes, or P-N junctions, if included within the circuit arrangement. Thus, a diode D1 is provided between the transistor T2 of the phase splitter stage and the second rail maintained at zero potential level. The diode D1, which conveniently comprises the collector-base P-N junction of a transistor having its emitter-base P-N junction short-circuited, is between the transistor T2 and the resistor R3. The resistors R2 and R3 have the same values as in the conventional double diffused device.

Because of the presence of the diode D1 it is required further to modify the known circuit arrangement of the conventional double diffused device so as to be able to turn off completely the active pull-up transistor T4 of the known circuit arrangement when the device is in the low input state. The modification comprises replacing the transistors T4 and T5 of the known circuit arrangement of the conventional double diffused device with a modified Darlington pair of transistors. The first transistor and the second transistor of the Darlington pair of transistors are indicated T4' and T5', respectively, in FIG. 3. The collectors of both transistors T4' and T5' are connected via the resistor R4 to the supply rail, and the emitter of the transistor T5' is connected to the collector of the output transistor T3. The Darlington pair of transistors is modified by including a resistor R5, having a value of 250 ohms, between the emitter of the first transistor T4' and the base of the second transistor T5', and by including a resistor R6, having a value of 1 Kilohm, between the base and the emitter of the second transistor T5'. The output of the device is again provided at a point between the transistors T3 and T5', and is connected to an output terminal.

The presence of the resistor R5 keeps the second transistor T5', which replaces the diode T5 of the known circuit arrangement of the conventional, double-diffused TTL circuit arrangement, turned off when the device is in the low input state. The potential difference across the resistor R5, which is approximately 200 millivolts, is compensated for, partially, by the high gain of the Darlington pair ensuring that there is a smaller potential difference across the resistor R2 than in the double diffused TTL circuit device, and also by the lower current leakage within the collector-diffusion-isolation transistors than for the conventional double diffused transistors. Thus, the resistors R5 does not have a significant effect on the high state output voltage of the device.

The transistors T2, T3 and T4' are provided with feedback emitters, connected directly to the bases of their transistors, to reduce the concentrations of charge carrier stored within these transistors.

The operation of the TTL circuit arrangement according to the present invention, and as shown in FIG. 3, is substantially the same as that of the known TTL circuit arrangement shown in FIG. 1.

Transistors T2, T3, and T4' are capable of saturating, but transistor T5' does not saturate.

The ranges of the D.C. and A.C. operating characteristics of an epitaxial-base TTL circuit device embodying the circuit arrangement of FIG. 3, and having bipolar transistors of the collector-diffusion-isolation construction, are substantially the same as that of a conventional double diffused TTL circuit device and referred to above. The high state output potential level is insignificantly lower for an epitaxial-base TTL circuit device than for a conventional double diffused TTL circuit device.

In an epitaxial-base TTL circuit device, in which is embodied the circuit arrangement of FIG. 3, all the constituent bipolar transistors have the same construction. Other types of circuit element provided within the semiconductor body each have a construction closely resembling that of the provided bipolar transistors. At least one of the resistors of the device may comprise a thin film resistor on a layer of passivating material on the semiconductor body of the device.

The electrical interconnections required between the constituent circuit elements of the TTL circuit device are formed simultaneously with the contacts for the circuit elements, from the initially-continuous metal layer provided on the layer of passivating material on the semiconductor body of the device.

An epitaxial-base TTL circuit device according to the present invention, instead of having bipolar transistors of the so-called collector-diffusion-isolation construction, may have the Isoplanar, or VIP, or V-ATE construction. For each such epitaxial-base transistor construction the TTL devices according to the present invention are formed in a semiconductor body having a shallow epitaxial layer of P conductivity type on a substrate of the same conductivity type, both the epitaxial layer and the substrate being of high resistivity material. Each bipolar transistor provided thereby has a N type collector which at least includes a heavily doped buried layer at a portion of the interface between the substrate and the epitaxial layer. The base is defined within the epitaxial layer and comprises at least partially an unmodified part of the epitaxial layer, and the emitter comprises a diffused part within the base. In each epitaxial-base TTL circuit device other types of circuit element provided within the semiconductor body of the device have a construction closely resembling that of the construction of the bipolar transistors provided.

The pull-up stage may have any convenient form, instead of including a modified Darlington pair of transistors, and may be either active or passive in form.

A non-gold-doped TTL circuit arrangement according to the present invention may have any convenient construction, and may have a construction other than an epitaxial-base construction. Thus, it may have a non-gold-doped, double diffused construction.

A TTL circuit arrangement according to the present invention is energised by a supply with a voltage greater than 4.5 volts.

What I claim is:

1. A transistor-transistor logic circuit arrangement having NPN transistors, and to be energised by a potential supply of at least 4.5 volts, including a multi-emitter input transistor, having an emitter individually connected to each required input for the circuit arrangement, the base is connected via a resistor to a first rail to be maintained at a first, finite positive potential level, the collector is connected to the base to reduce, in the operation of the circuit arrangement, the concentration of stored charge carriers within the transistor, and the collector is also connected to a phase splitter stage connected between the first rail and a second rail to be maintained at a second potential level, less positive than the potential level of the first rail, a diode is provided within the phase splitter stage, and is connected between the input transistor and the second rail to ensure that the input threshold level of the circuit arrangement is above the potential level of the second rail by substantially the maximum obtainable potential difference across two forward biased diodes, one output of the phase splitter stage is connected to the base of an output transistor for the circuit arrangement, the emitter of the output transistor is connected to the second rail, and the other output of the phase splitter stage is connected to a pull-up stage for the output transistor.

2. A circuit arrangement as claimed in claim 1 with the pull-up stage comprising a modified Darlington pair of transistors having a first transistor the base of which is connected to the associated output of the phase splitter stage, and a second transistor the emitter of which is connected to the collector of the output transistor, the collector of both the first and second transistors are connected via a common resistor to the first rail, the emitter of the first transistor is connected via a resistor to the base of the second transistor, which base in turn is connected via a further resistor to the emitter of the second transistor.

3. A non-gold-doped transistor-transistor logic circuit device has at least partially embodied in a monolithic semiconductor body a circuit arrangement having NPN transistors, and to be energised by a potential supply of at least 4.5 volts, including a multi-emitter input transistor, having an emitter individually connected to each required input for the circuit arrangement, the base is connected via a resistor to a first rail to be maintained at a first, finite positive level, the collector is connected to the base to reduce, in the operation of the circuit arrangement, the concentration of stored charge carriers within the transistor, and the collector is also connected to a phase splitter stage connected between the first rail and a second rail to be maintained at a second potential level, less positive than the potential level of the first rail, a diode is provided within the phase splitter stage, and is connected between the input transistor and the second rail to ensure that the input threshold level of the circuit arrangement is above the potential level of the second rail by substantially the maximum obtainable potential difference across two forward biased diodes, one output of the phase splitter stage is connected to the base of an output transistor for the circuit arrangement, the emitter of the output transistor is connected to the second rail, and the other output of the phase splitter stage is connected to a pull-up stage for the output transistor.

4. A device as claimed in claim 3 with the pull-up stage comprising a modified Darlington pair of transistors having a first transistor the base of which is connected to the associated output of the phase splitter stage, and a second transistor the emitter of which is connected to the collector of the output transistor, the collectors of both the first and second transistors are connected via a common resistor to the first rail, the emitter of the first transistor is connected via a resistor to the base of the second transistor, which base in turn is connected via a further resistor to the emitter of the second transistor.

5. A device as claimed in claim 3 in which the semiconductor body comprises a thin epitaxial layer of P conductivity type on a substrate of the same conductivity type, and the base of each constituent transistor comprises at least partially an unmodified region of the epitaxial layer.

6. A device as claimed in claim 5 in which each constituent transistor has the so-called collector-diffusion-isolation construction, the N type collector of each transistor comprising both a buried layer at a portion of the interface between the epitaxial layer and the substrate and an isolation barrier for the transistor extending through the epitaxial layer to contact the buried layer.

* * * * *